(12) United States Patent
Reigneau

(10) Patent No.: US 8,537,263 B2
(45) Date of Patent: Sep. 17, 2013

(54) OPTICAL NAVIGATION DEVICES AND ASSOCIATED METHODS

(75) Inventor: Mathieu Reigneau, Amilly (FR)

(73) Assignee: STMicroelectronics (R&D) Ltd., Marlow Bucks (GB)

( * ) Notice: Subject to any disclaimer, the term of this patent is extended or adjusted under 35 U.S.C. 154(b) by 398 days.

(21) Appl. No.: 12/969,956

(22) Filed: Dec. 16, 2010

(65) Prior Publication Data

US 2011/0169971 A1 Jul. 14, 2011

(30) Foreign Application Priority Data

Jan. 11, 2010 (GB) .................................. 1000348.1

(51) Int. Cl.
*H04N 5/225* (2006.01)
*G06F 3/033* (2013.01)

(52) U.S. Cl.
USPC ........................................ 348/340; 345/166

(58) Field of Classification Search
USPC ................. 348/335, 340; 345/156, 157, 163, 345/166
See application file for complete search history.

(56) References Cited

U.S. PATENT DOCUMENTS

| 4,081,812 A * | 3/1978 | Flother .......................... 396/529 |
| 7,567,342 B2 * | 7/2009 | Reinhold et al. ................. 356/71 |
| 7,880,797 B2 * | 2/2011 | Nanjo et al. ................... 348/335 |
| 2007/0024714 A1 * | 2/2007 | Kim et al. ................. 348/207.99 |

FOREIGN PATENT DOCUMENTS

| JP | 2003167195 | 6/2003 |
| KR | 2008/0043412 | 5/2008 |

\* cited by examiner

*Primary Examiner* — Timothy J Henn
(74) *Attorney, Agent, or Firm* — Allen, Dyer, Doppelt, Milbrath & Gilchrist, P.A.

(57) ABSTRACT

The imaging device has an imaging surface and a sensor, wherein the imaging surface is illuminated and reflects at least some of the illumination to the sensor to detect an image. The imaging device has a width and an optical path passing therethrough, wherein the optical path exhibits distortion as a result of the width of the device and the nature of the optical path. The imaging device includes an optical element which in use compensates for the distortion by generating a magnification profile across a tangential plane of the device at the sensor.

26 Claims, 2 Drawing Sheets

OPTICAL NAVIGATION DEVICES AND ASSOCIATED METHODS

FIELD OF THE INVENTION

The present invention relates to optical navigation devices such as, for example, optical mice.

BACKGROUND OF THE INVENTION

Computer devices are becoming ever smaller and full computing functionality can be found on phones and smart phones and other personal digital assistants (FDA). As the computer devices become smaller, the various features of the computer devices may also become smaller. This includes a desire for smaller input systems for the user to enter inputs into the device. One such input system is an optical navigation device. Many computer devices, large and small, are equipped with optical navigation devices. However, with the smaller computer devices, minimizing the size of the optical navigation device can often be restrictive and problematic.

A number of devices have been proposed which offer thin optical navigation devices. These have had some success but the design has generally not addressed all of the problems associated with thin imaging devices. One such outstanding problem is associated with the positioning of the sensor. Ideally the sensor is located as close to an imaging surface of the imaging device as is possible. This can be achieved by de-centering the sensor. However, this may then give rise to distortion such as perspective distortion, in the image generated at the sensor. In addition, such de-centering of the sensor can cause problems with shielding the sensor from any stray light which enters the imaging surface.

In professional and architectural photography, perspective control lenses exist. These may require considerable space for the design which incorporates the ability to tilt and de-center the input lens to correct for any perspective effect. However, the requirement of greater space may be undesirable in small-scale optical navigation devices.

SUMMARY OF THE INVENTION

It is an object of the present invention to overcome at least some of the problems associated with the prior art as discussed above. It is a further object of the present invention to provide an optical navigation device having a thin sensor which may have less distortion than previous devices.

According to one aspect of the present invention there is provided an imaging device of the type having an imaging surface and a sensor, wherein the imaging surface is illuminated and reflects at least some of the illumination to the sensor to detect an image. The imaging device has a predetermined width and an optical path passing therethrough, wherein the optical path exhibits distortion as a result of the width of the device and the nature of the optical path. The imaging device includes an optical element which in use compensates for the distortion by generating a magnification profile across a tangential plane of the device at the sensor.

The present invention offers a number of benefits which may include a reduction to the perspective distortion and stray light shielding while maintaining a required thickness.

BRIEF DESCRIPTION OF THE DRAWINGS

Reference will now be made, by way of example, to the accompanying drawings, in which.

DETAILED DESCRIPTION OF THE PREFERRED EMBODIMENTS

The present invention relates to an imaging device associated with an optical navigation device. The optical navigation device may be a mouse of small-scale which is intended to be operated via frustrated total internal reflection (F-TIR) to recognize the movement of a finger on an imaging surface. This type of mouse is herein referred to as a finger mouse.

Figure 2:
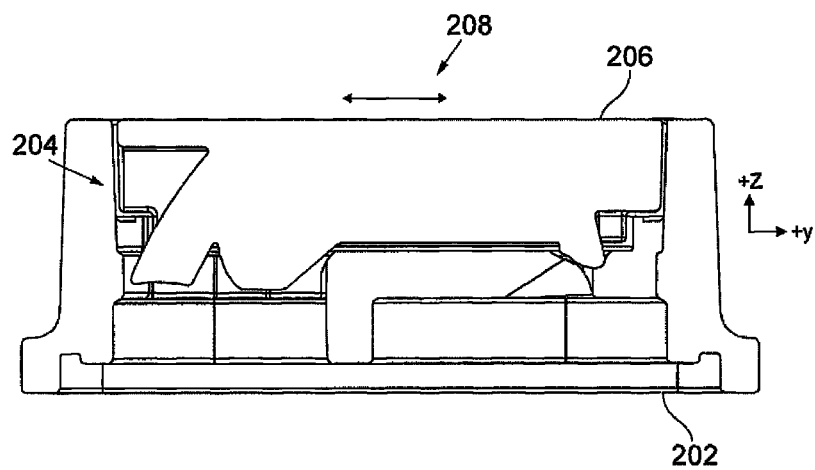
FIG. 2 is a schematic diagram illustrating an optical navigation device, in accordance with an embodiment of the present invention.

FIG. 2 shows an example of a finger mouse 200 in accordance with an embodiment of the present invention. The finger mouse includes a base 202; an imaging device shown generally at 204; and an LED and sensor, both not shown. The top surface 206 of the imaging device 204 includes an imaging surface 208 which is positioned at a predetermined location on the surface 206. It will be appreciated that the position of the imaging surface will depend on the optical path or paths that light takes from the LED to the sensor. In addition, the position of the sensor relative to the imaging device will depend on the optics forming the imaging device. This will be discussed in more detail below.

Figure 1:
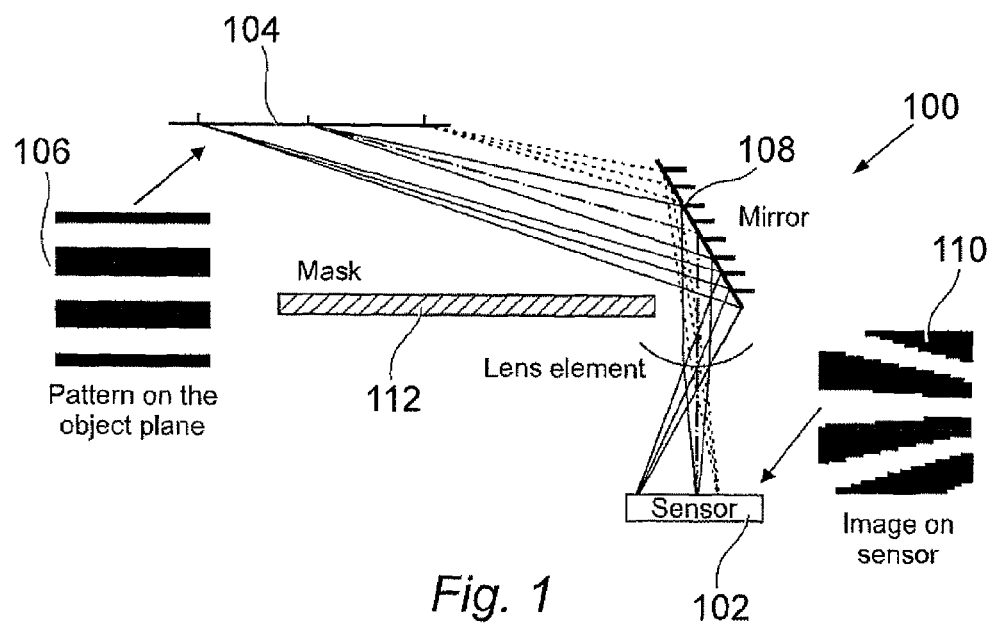
FIG. 1 is a cross-sectional diagram of an imaging device for an optical navigation device, in accordance with the prior art.

FIG. 1 shows a conventional imaging device 100 having a sensor 102. An imaging surface 104 gives rise to a specific pattern 106 after illumination by an appropriate light source, for example an LED. The pattern 106 is reflected by mirror 108 onto the sensor. Due to the thinness of the imaging device the resultant image on the sensor exhibits significant distortion, as is shown at 110. This distortion is clearly unacceptable as it can significantly impact the accuracy of operation of the sensor and ultimately the imaging device. The distortion is due to the angle of the optical axis to the normal in the object plane and gives rise to what is known as perspective distortion. Perspective distortion is a pattern with parallel lines along the direction of the distortion that become convergent in the image plane.

Perspective distortion is essentially a warping or transformation of an object that differs significantly from what the object would look like with a normal focal length, this is typically worse with a narrow field of view. The FIG. 1 arrangement also gives rise to light pollution at the sensor, despite the existence of opaque mask 112, as there are direct routes for ambient light to enter the imaging device and then pass to the sensor. This is another undesirable aspect of the prior art arrangement. The present invention seeks to overcome perspective correction without changing the thickness of the imaging device.

Figure 3:
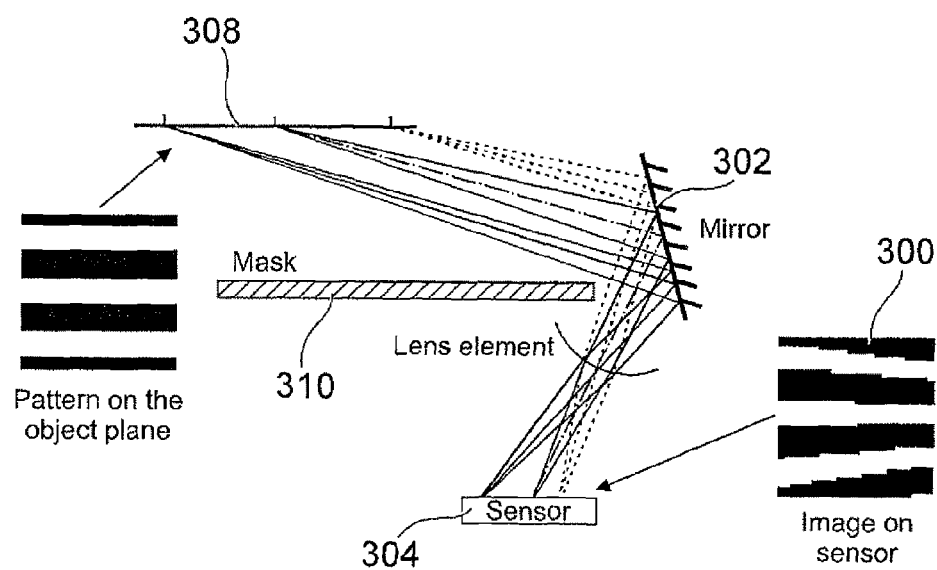
FIG. 3 is a cross-sectional diagram of a first imaging device for the optical navigation device, in accordance with an embodiment of the present invention.

Referring to FIG. 3, a degree of improvement on perspective distortion 300 can be achieved by tilting the mirror 302 and moving the position of sensor 304. Within the confines of the width of the imaging device (the distance from the imaging surface 308 and the sensor 304), the mirror can be tilted to be between 0° and 30° from the vertical. The limiting factor of the degree of tilt on mirror 302 is the relative position of the sensor 304 and the opaque mask 310. The mirror can be tilted in as much as the reflected beams from the mirror are not cut off by the mask 310. The effect of tilting the mirror and moving the sensor extends the optical path of the reflected path from the imaging surface.

The movement of the mirror and the sensor has a compensation effect on the perspective distortion. This is caused by the fact that the tilt of the mirror and the position of the sensor give rise to different magnification along the tangential plane of the optical drawing. The three points (shown on the sensor in FIG. 3) each present a different level of magnification. It will be appreciated that the points are shown for ease of comprehension of the optical drawing but in fact the light beam is a continuum and as such the magnification will vary over the continuum rather than on a point by point basis.

The distance between the imaging surface 308 and sensor 304 in the present embodiment is in the region of 2.5 mm. This distance is the thickness of the imaging device and can vary between 2 mm and 3 mm. Ideally, the thickness is not generally greater than 5 mm. Moving the sensor has a further advantage in that the sensor is completely protected by the mask and no stray or ambient light can reach the sensor.

Figure 4:
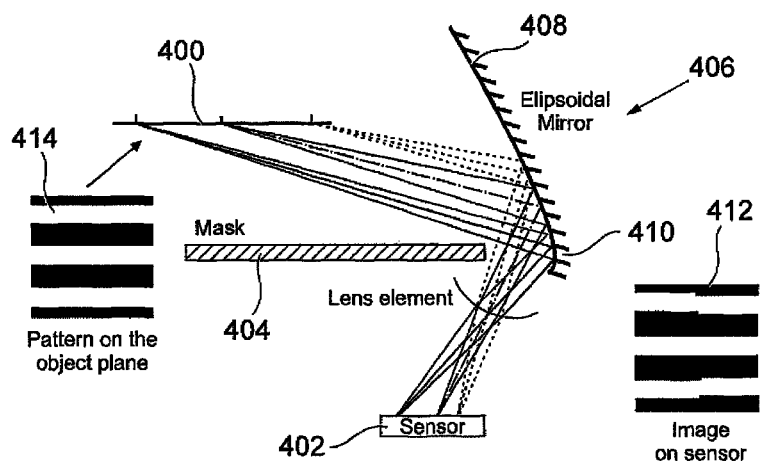
FIG. 4 is a cross-sectional diagram of a second imaging device for the optical navigation device, in accordance with an embodiment of the present invention.

Referring to FIG. 4, a second embodiment of the present invention is presented. The embodiment includes an imaging surface 400, sensor 402 and, a mask 404. In addition, the imaging device includes an ellipsoidal mirror 406. The ellipsoidal mirror has a substantially flat portion 408 and a curved portion 410. The ellipsoidal mirror may be tilted as shown and described with reference to FIG. 3, or may be used in a "non-tilted" orientation. The choice will depend on the particular optical design. The sensor 402 is in a similar position to that shown in the FIG. 3 embodiment. The ellipsoidal mirror reflects light from the imaging surface onto the sensor.

Due to the fact that some of the reflection occurs on a flat surface and some of the reflection occurs on a curved surface the final image on the sensor has less perspective distortion than would otherwise exist. This is due to the fact that the mirror has two different radii of curvature. The two radii of curvature are significantly different from one another which gives rise to a compensation for any stretch effect that would otherwise be evident due to the angles within the imaging device. Use of the two different radii of curvature enables the imaging device to be kept to a small size but still achieve minimal perspective distortion. In addition, the mirror (either tilted or not) gives rise to a variable magnification profile across the tangential plane of the drawing which effects the compensation to the perspective distortion. If the mirror is in a tilted orientation there will be a great degree of variability in the magnification profile, which may be desirable in certain situations.

The mirror center is designed such that it does not correspond to the center of the optical path of the light from the imaging surface to the sensor. This has further advantages in that the equivalent radius of curvature is different along the vertical axis of the mirror, and so the magnification linking the size of the object and the image is different along this axis, correcting the perspective distortion. The ellipsoidal mirror is one example of a mirror having different radii of curvature. It will be appreciated that different shapes of mirror may be equally relevant provided the difference in radii of curvature is sufficient to compensate for the stretch effect in such a thin device.

Where the mirror is an ellipsoid, the shape of the ellipsoidal mirror is determined by the equation of an ellipse. The shape of the mirror and the relative position of the sensor compensate for the perspective distortion that would otherwise exist in an equivalent prior art optical path. This is brought about by the varying magnification profile across the tangential plane of the drawing. As the sensor is located under the opaque mask 404 the sensor is completely protected by the mask and no stray or ambient light can reach the sensor.

The resultant image produced by the FIG. 4 embodiment is shown at 412. Comparing with the original pattern 414 it can be seen that the perspective distortion is minimized in image 412 relative to the prior art.

In use in an optical navigation system, the imaging device enables compensation for and/or reduction of any perspective distortion thereby improving the operation of the imaging device when used as a finger mouse. The image produced at the sensor 402 will have considerably less perspective distortion than in prior art systems and is substantially equivalent to the original pattern that illuminates the imaging surface 400.

The present embodiments thus provide a more accurate imaging device which is still capable of retaining the required thinness of generally less than 5 mm and desirably 3 mm or less. The imaging device can be formed from a single piece molding as shown in FIG. 2. The molding includes each of the individual optical elements shown in FIG. 4, namely the illumination optics (not shown); the imaging surface 400; the mirror 406; and the sensor 402.

The imaging device could alternatively be made in other appropriate ways with different optical elements which produce the same optical effect. The imaging device may also be made from a number of different elements, rather than a single molding. The technique for forming the imaging device may include techniques other than molding, such as replication, stamping, embossing or machining. The optical device is typically made from Polycarbonate (such as Lexan (™)), acrylics such as PMMA (polymethyl methacrylate), glass, Polyethylene or PVB (Polyvinyl butyral). The sensor is of any appropriate type and may be a CMOS sensor having an array of pixels for measuring reflected light at different locations to produce an image such as image 412.

The illumination source is for example an LED which may be of any appropriate type and may generate a source in the "optical" or non-optical ranges. Accordingly, reference to optics and optical are intended to cover wavelengths which are not in the human visible range. The illuminating optics which take the illumination from the source to the imaging surface may be of any appropriate type, for example as is shown in co-pending application reference P115041.GB.01 (incorporated herein by reference).

The imaging device is intended for use in an optical navigation device; however it will be appreciated that the imaging device could be used in any appropriate device, for example fingerprint reader or Lab-on-chip/Bio-Optical sensor systems (which detect chemi-fluorescence for medical and/or bio-testing applications).

The optical navigation device may be used in any suitable devices such as a mobile or smart telephone, other personal or communications devices, a computer, a remote controller, access modules for doors and the like, a camera or any other suitable device.

That which is claimed is:

1. An imaging device having a width and an optical path passing therethrough, the imaging device comprising:
   a sensor;
   an imaging surface configured to be illuminated and reflect at least some of the illumination along the optical path to the sensor to detect an image; and
   an optical element in the optical path configured to compensate for perspective distortion exhibited by the optical path by generating a magnification profile across a tangential plane of the imaging device at the sensor;
   wherein the sensor, the imaging surface and the optical element are formed as a unitary element.

2. The imaging device of claim 1, wherein the width is less than 5 mm.

3. The imaging device of claim 1, wherein the width is less than 3 mm.

4. The imaging device of claim 1, wherein the optical element comprises a mirror configured to direct light from the imaging surface to the sensor.

5. The imaging device of claim 4, wherein the mirror comprises an ellipsoidal mirror.

6. The imaging device of claim 4, wherein the mirror is positioned at an angle of between 0° and 30° from vertical.

7. The imaging device of claim 1, wherein the sensor is positioned at a set distance from the optical element and the imaging surface.

8. The imaging device of claim 7, further comprising a mask between the sensor and the imaging surface to reduce stray illumination.

9. The imaging device of claim 1, wherein the unitary element comprises a molded element.

10. An electronic device comprising:
   an imaging device having a width and an optical path passing therethrough, the imaging device comprising
      a sensor,
      an imaging surface configured to be illuminated and reflect at least some of the illumination along the optical path to the sensor to detect an image, and
      an optical element in the optical path configured to compensate for perspective distortion exhibited by the optical path by generating a magnification profile across a tangential plane of the imaging device at the sensor,
   wherein the sensor, the imaging surface and the optical element are formed as a unitary element.

11. The electronic device of claim 10, wherein the electronic device is an optical navigation device.

12. The electronic device of claim 10, wherein the electronic device is an optical mouse.

13. The electronic device of claim 12, wherein the mouse is a finger mouse.

14. The electronic device of claim 10, wherein the electronic device is a computer.

15. The electronic device of claim 10, wherein the electronic device is a mobile wireless phone.

16. The electronic device of claim 10, wherein the electronic device is a camera.

17. The electronic device of claim 10, wherein the electronic device is a smart phone.

18. A method of making an imaging device having a width and an optical path passing therethrough, the method comprising:
   positioning a sensor relative to an imaging surface, the imaging surface configured to be illuminated and reflect at least some of the illumination along the optical path to the sensor to detect an image;
   providing an optical element in the optical path and configured to compensate for perspective distortion exhibited by the optical path by generating a magnification profile across a tangential plane of the imaging device at the sensor; and
   forming the sensor, the imaging surface and the optical element as a unitary element.

19. The method of claim 18, wherein the width is less than 5 mm.

20. The method of claim 18, wherein the width is less than 3 mm.

21. The method of claim 18, wherein the optical element comprises a mirror configured to direct light from the imaging surface to the sensor.

22. The method of claim 21, wherein the mirror comprises an ellipsoidal mirror.

23. The method of claim 21, wherein the mirror is positioned at an angle of between 0° and 30° from vertical.

24. The method of claim 18, wherein the sensor is positioned at a set distance from the optical element and the imaging surface.

25. The method of claim 18, further comprising positioning a mask between the sensor and the imaging surface to reduce stray illumination.

26. The method of claim 18, wherein the unitary element comprises a molded element.

* * * * *